United States Patent
Lei et al.

(10) Patent No.: US 11,901,445 B2
(45) Date of Patent: Feb. 13, 2024

(54) TRANSISTOR AND METHODS OF FABRICATING A TRANSISTOR

(71) Applicant: GLOBALFOUNDRIES Singapore Pte. Ltd., Singapore (SG)

(72) Inventors: Jiacheng Lei, Singapore (SG); James Jerry Joseph, Singapore (SG); Lawrence Selvaraj Susai, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 398 days.

(21) Appl. No.: 17/097,012

(22) Filed: Nov. 13, 2020

(65) Prior Publication Data
US 2022/0157977 A1    May 19, 2022

(51) Int. Cl.
| H01L 29/778 | (2006.01) |
| H01L 29/66 | (2006.01) |
| H01L 29/40 | (2006.01) |
| H01L 29/417 | (2006.01) |
| H01L 29/423 | (2006.01) |

(52) U.S. Cl.
CPC ........ *H01L 29/7786* (2013.01); *H01L 29/401* (2013.01); *H01L 29/41775* (2013.01); *H01L 29/42316* (2013.01); *H01L 29/66462* (2013.01)

(58) Field of Classification Search
CPC ..... H01L 29/402–407; H01L 29/66431; H01L 29/66462; H01L 29/778–7789
See application file for complete search history.

(56) References Cited

U.S. PATENT DOCUMENTS

| 2013/0113018 A1* | 5/2013 | Wakita | H01L 29/205 257/190 |
| 2015/0123139 A1* | 5/2015 | Kim | H01L 29/66462 438/172 |
| 2016/0079405 A1* | 3/2016 | Saki | H01L 21/02211 257/190 |
| 2019/0288081 A1* | 9/2019 | Shindome | H01L 29/7787 |

(Continued)

OTHER PUBLICATIONS

Kim et al., "High Breakdown Voltage AlGaN/GaN HEMTs Employing Recessed Gate Edge Structure", CS MANTECH Conference, May 17-20, 2010, Portland, Oregon, USA, pp. 237-240.

(Continued)

*Primary Examiner* — Eric A. Ward
(74) *Attorney, Agent, or Firm* — VIERING JENTSCHURA & PARTNER MBB

(57) ABSTRACT

A transistor may include a buffer layer, source and drain contacts on the buffer layer, a barrier layer on the buffer layer, a conductive member on the barrier layer, a dielectric stack, and a gate metal. The barrier layer may be between the source and drain contacts. The conductive member may include a p-doped III-V compound. The dielectric stack may be on the barrier layer and on the conductive member. The dielectric stack may include a first dielectric layer and a second dielectric layer on the first dielectric layer. First and second trenches may extend through the dielectric stack to the conductive member and to the first dielectric layer, respectively. The gate metal may be on the dielectric stack, and may contact the conductive member through the first trench and may contact the first dielectric layer through the second trench.

20 Claims, 12 Drawing Sheets

(56) References Cited

U.S. PATENT DOCUMENTS

2020/0365718 A1* 11/2020 Lee ................... H01L 29/205
2020/0373420 A1* 11/2020 Chou ................. H01L 29/7786
2022/0406925 A1* 12/2022 Jacquet ............. H01L 29/2003

OTHER PUBLICATIONS

Lenci et al., "Au-Free AlGaN/GaN Power Diode on 8-in Si Substrate With Gated Edge Termination", IEEE Electron Device Letters, August 2013, pp. 1035-1037, vol. 34, No. 8.

You et al., "An Industry-Ready 200 mm p-GaN E-mode GaN-on-Si power Technology", 30th International Symposium on Power Semiconductor Devices & ICs, May 13-17, 2018, Chicago, USA, pp. 284-287.

Wei et al., "Charge Storage Mechanism of Drain Induced Dynamic Threshold Voltage Shift in p-GaN Gate HEMTs", IEEE Electron Device Letters, Apr. 2019, pp. 526-529, vol. 40, No. 4.

* cited by examiner

TRANSISTOR AND METHODS OF FABRICATING A TRANSISTOR

TECHNICAL FIELD

Various embodiments relate to transistors and methods of fabricating transistors. In particular, various embodiments relate to high-electron mobility transistors.

BACKGROUND

A high-electron mobility transistor (HEMT) is a field-effect transistor where the channel is an interface between two semiconductor materials with different band gaps. HEMTs are desirable as power switches, due to their ability to withstand high voltages and operate at high frequencies. Various techniques have been developed to enable HEMTs to operate in enhancement mode, such that the HEMT is normally off and requires a positive bias applied at the gate in order to conduct current. Among them, the p-GaN gate HEMT is able to achieve a good balance between achieving normally-off operation and ease of mass production. However, the p-GaN gate HEMT is susceptible to instabilities in the threshold voltage when the drain voltage switches between OFF-state with high drain bias and ON-state with high current.

SUMMARY

According to various embodiments, a transistor may include a buffer layer, source and drain contacts on the buffer layer, a barrier layer on the buffer layer, a conductive member on the barrier layer, a dielectric stack, and a gate metal. The barrier layer may be between the source and drain contacts. The conductive member may include a p-doped III-V compound. The dielectric stack may be on the barrier layer and on the conductive member. The dielectric stack may include a first dielectric layer and a second dielectric layer on the first dielectric layer. A first trench may extend through the dielectric stack to the conductive member. A second trench may extend through the dielectric stack to the first dielectric layer. The gate metal may be on the dielectric stack. The gate metal may contact the conductive member through the first trench and may contact the first dielectric layer through the second trench.

According to various embodiments, there may be provided a method of fabricating a transistor. The method may include forming source and drain contacts on a buffer layer. The method may further include forming a barrier layer on the buffer layer, between the source and drain contacts. The method may further include forming a conductive member on the barrier layer. The conductive member may include a p-doped III-V compound. The method may further include forming a dielectric stack on the barrier layer and on the conductive member. The dielectric stack may include a first dielectric layer and a second dielectric layer on the first dielectric layer. The method may include forming a first trench and a second trench in the dielectric stack. The first trench may extend to the conductive member. The second trench may extend to the first dielectric layer. The method may further include forming a gate metal on the dielectric stack. The gate metal may contact the conductive member through the first trench, and may contact the first dielectric layer through the second trench.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1A:
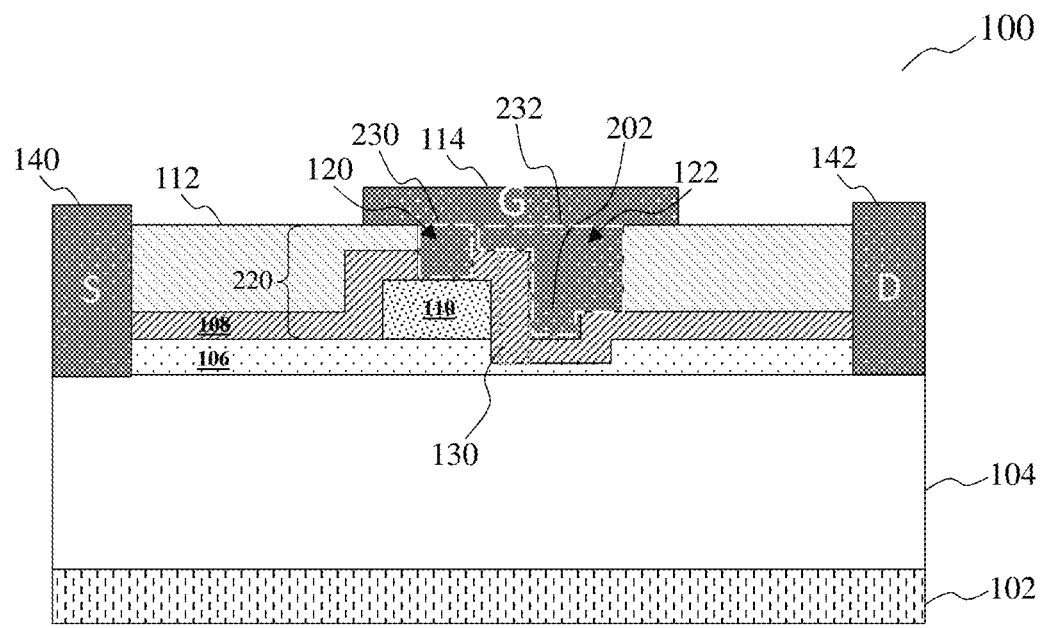
FIG. 1A shows a simplified cross-sectional view of a transistor according to various non-limiting embodiments.

The embodiments generally relate to transistors. For example, some embodiments relate to a transistor having a gate metal extending into a recess in a dielectric stack, and having a p-GaN region under the gate metal.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1A shows a simplified cross-sectional view of a transistor 100 according to various non-limiting embodiments. The transistor 100 may be a HEMT. The transistor 100 may include a substrate 102, a buffer layer 104, and a barrier layer 106. The substrate 102 may include a semiconductor material such as silicon, sapphire ($Al_2O_3$), silicon carbide (SiC), or poly aluminum nitride (AlN). The buffer layer 104 may be formed on the substrate 102. The barrier layer 106 may be formed on the buffer layer 104. The barrier layer 106 may have a recess 202. The buffer layer 104 and the barrier layer 106 may be epitaxy layers grown on the substrate 102. The barrier layer 106 may be formed by selective epitaxial growth, or by selective etching of an epitaxial layer.

The transistor 100 may further include a conductive member 110, disposed on the barrier layer 106. The conductive member 110 may include a p-doped semiconductor. The p-doped semiconductor may include a group III-V compound, for example, GaN.

The transistor 100 may further include a dielectric stack 220. The dielectric stack 220 may include a first dielectric layer 108 and a second dielectric layer 112. The first and second dielectric layers 108, 112 may differ in material composition, so that they may be selectively etched during the production process. For example, the first dielectric layer 108 may include an oxide or nitride, such as $Al_2O_3$, AlON, AlN or $SiO_2$. For example, the second dielectric layer 112 may include a nitride or oxide, such as $SiN_x$ or $SiO_2$. Alternatively, the material composition of the first and second dielectric layers may be interchanged. The second dielectric layer 112 may be thicker than the first dielectric layer 108. The first dielectric layer 108 may be disposed on the barrier layer 106, and may extend at least partially over the conductive member 110. The first dielectric layer 108 may also extend into the recess of the barrier layer 106. The second dielectric layer 112 may be disposed at least partially on the first dielectric layer 108. The dielectric stack may have a first trench 230 and a second trench 232 formed in it. The first trench 230 may be formed over the conductive member 110 and may reach the conductive member 110. The second trench 232 may reach the first dielectric layer 108. The second trench 232 may be offset from the first trench 230. The second trench 232 may be adjacent to the first trench 230. The second trench 232 may be deeper than the first trench 230.

The transistor 100 may further include a gate metal 114. The gate metal 114 may be at least partially disposed on the second dielectric layer 112. The resulting overhang of the gate metal 114 over the second dielectric layer 112 may serve as a field plate. The gate metal 114 may contact the conductive member 110 through the first trench 230 and may contact the first dielectric layer 108 through the second trench 232. The gate metal 114 may fill each of the first and second trenches 230, 232. A first region 120 of the gate metal 114 may fill the first trench 230 while a second region 122 of the gate metal 114 may fill the second trench 232. The first region 120 may be separated from the barrier layer 106 by the conductive member 110; whereas, the second region 122 may be separated from the barrier layer 106 by the first dielectric layer 108. In other words, the conductive member 110 may lie between the first region 120 and the barrier layer 106 while a region of the first dielectric layer 108 may lie between the second region 122 and the barrier layer 106. A segment 130 of the first dielectric layer 108 may be positioned between the first and second regions 120, 122 of the gate metal 114. The segment 130 may line a side wall of the conductive member 110. The side wall may be transverse, or perpendicular to a lower surface of the conductive member 110 that contacts the barrier layer 106.

The transistor 100 may further include a source contact 140 and a drain contact 142 at opposite sides of the gate metal 114. The dielectric stack may insulate the gate metal 114 from each of the source contact 140 and the drain contact 142. Each of the source contact 140 and the drain contact 142 may contact the buffer layer 104 and the barrier layer 106. The source and drain contacts 140, 142 may also contact each of the first and second dielectric layers 108, 112. The source contact 140 may be formed nearer to the first region 120 than the second region 122. The drain contact 142 may be formed nearer to the second region 122 than to the first region 120. In other words, the second region 122 of the gate metal 114 may be disposed at the drain side of the gate metal 114, while the first region 120 of the gate metal 114 may be disposed at the source side of the gate metal 114. The characteristics and dimensions of various components of the transistor 100 will be described subsequently, with respect to FIG. 2F.

According to various non-limiting embodiments, the buffer layer 104 and the barrier layer 106 may include group III-V semiconductor materials. For example, the buffer layer 104 may include GaN, AlGaN and AlN. For example, the barrier layer 106 may include aluminum gallium nitride (AlGaN). The buffer layer 104 and the barrier layer 106 may have different band gaps such that the junction between these layers is the transistor channel.

Figure 1B:
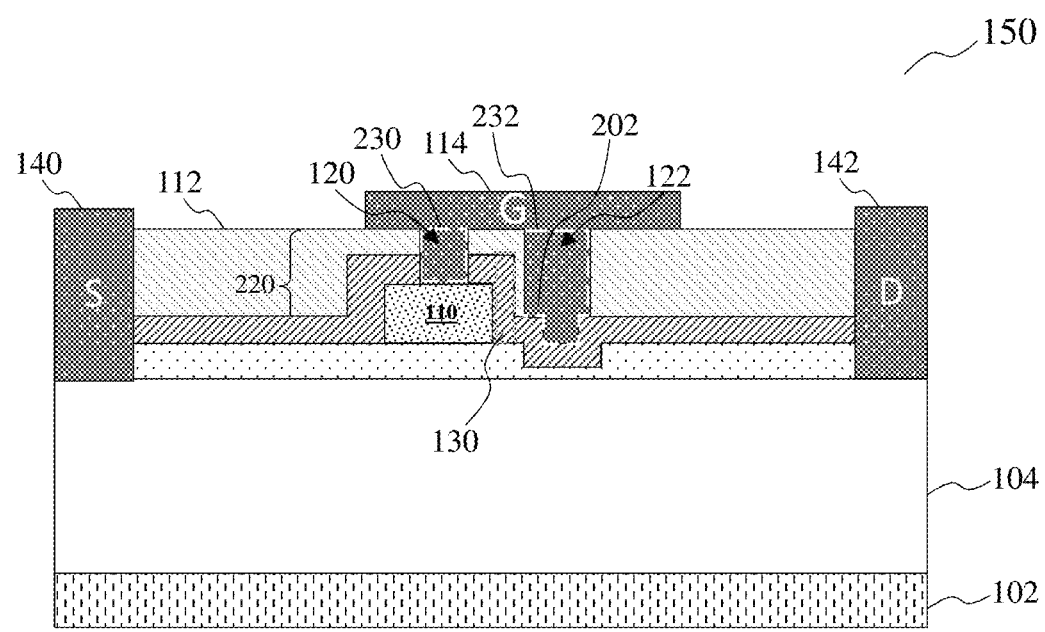
FIG. 1B shows a simplified cross-sectional view of a transistor according to various non-limiting embodiments.

FIG. 1B shows a simplified cross-sectional view of a transistor 150 according to various non-limiting embodiments. The transistor 150 may be similar to the transistor 100. However, in the transistor 150, the second trench 232 may not be adjacent to the first trench 230. The second dielectric layer 112 may be partially disposed between the first trench 230 and the second trench 232. In other words, the second trench 232 may be separated from the first trench 230 by a portion of the second dielectric layer 112.

FIGS. 2A to 2F show simplified cross-sectional views illustrating a method of fabricating the transistor 100 according to various non-limiting embodiments. For clarity of illustration, some reference numerals have been omitted from FIGS. 2A to 2F.

Figure 2A:
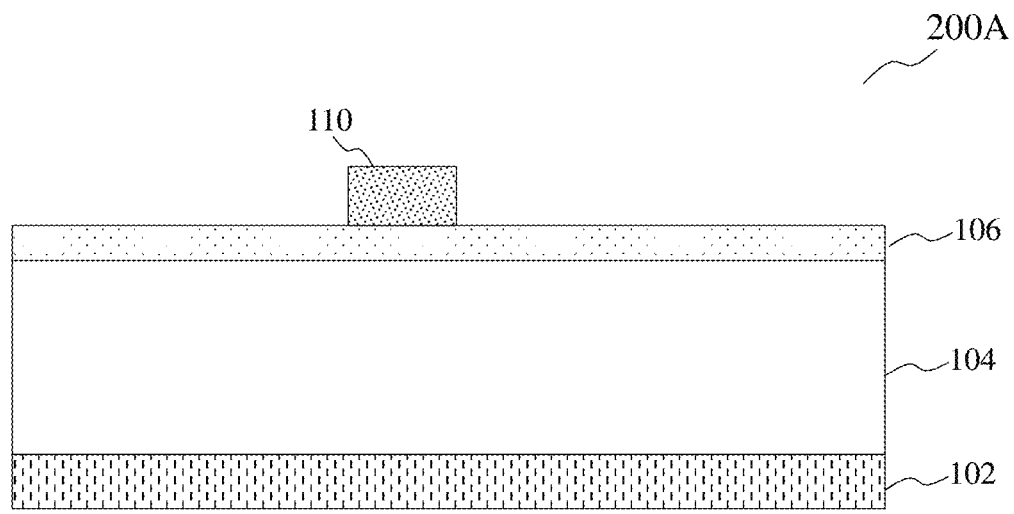
FIGS. 2A to 2F show simplified cross-sectional views illustrating a method of fabricating the transistor of FIG. 1, according to various non-limiting embodiments.

Referring to FIG. 2A, the method may include a process 200A. The process 200A may include providing the substrate 102, forming the buffer layer 104 on the substrate 102 and forming the barrier layer 106 on the buffer layer 104. The process 200A may further include forming the conductive member 110 on the barrier layer 106. Forming the conductive member 110 may include depositing a layer of p-type III-V compound (not shown) over the barrier layer 106, and etching the layer of p-type III-V compound such that only the conductive member 110 remains. In alternative embodiments, the barrier layer 110 may be formed by selective growth.

Figure 2B:
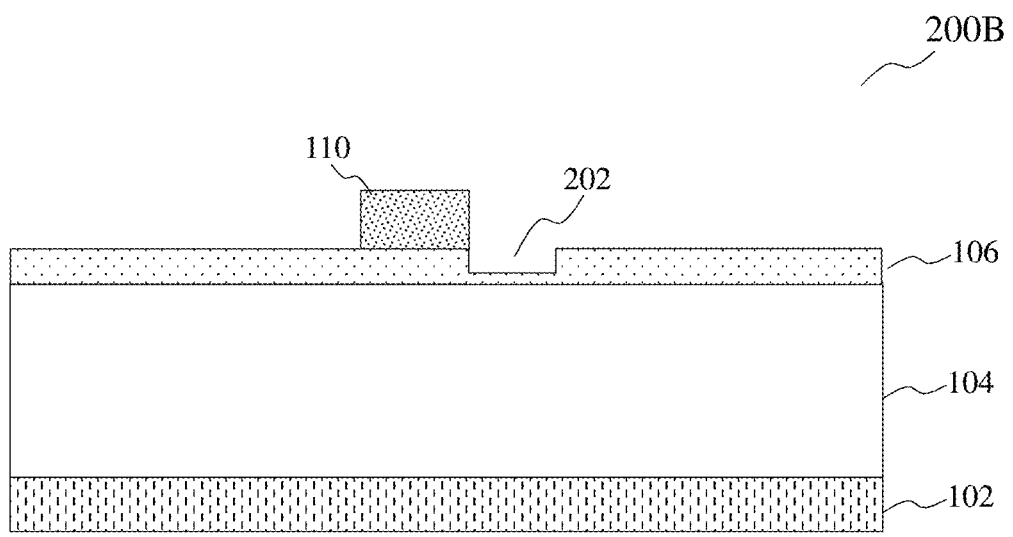

Referring to FIG. 2B, the method may include a process 200B. The process 200B may include removing part of the barrier layer 106 to form a recess 202 in the barrier layer 106. The process 200B may include forming a first mask layer (not shown) over the barrier layer 106 and the conductive member 110. The first mask layer may cover the conductive member 110 to protect it from being removed in an etching process. The first mask layer may be patterned to provide an opening to the barrier layer 106. The process 200B may further include etching the barrier layer 106 through the first mask layer. The etching process may remove part of the barrier layer 106 through the opening in the first mask layer to form the recess 202. Following the etching process, the first mask layer may be removed.

Figure 2C:
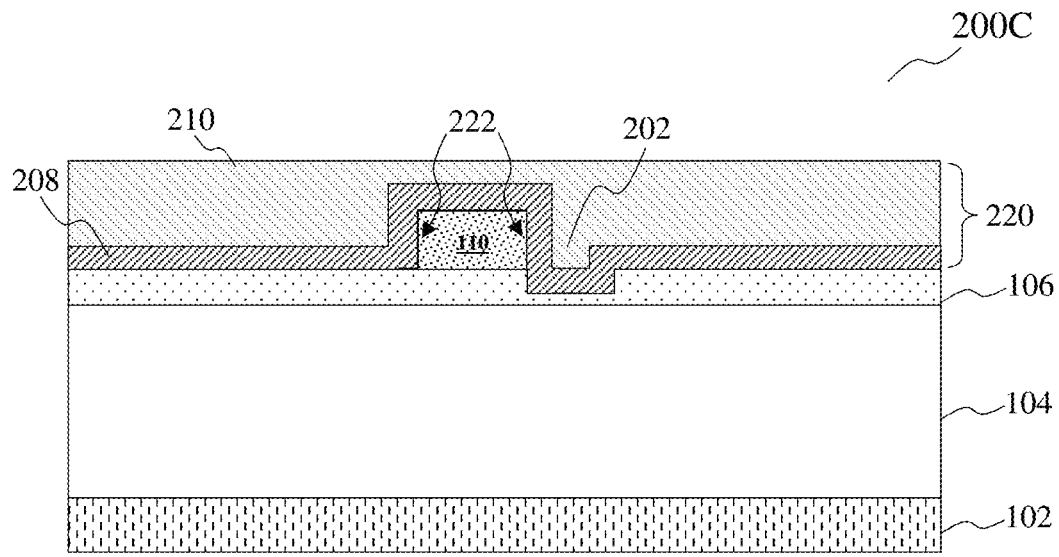

Referring to FIG. 2C, the method may include a process 200C. The process 200C may include forming the dielectric stack 220. The process 200C may include deposition of a layer of a first dielectric material 208 over the device formed from the process 200B. The first dielectric material 208 may lie on the barrier layer 106. The first dielectric material 208 may extend into the recess 202, and may line the inner surfaces of the recess 202. The first dielectric material 208 may also lie on the conductive member 110. The first dielectric material 208 may line side walls 222 of the conductive member 110. The first dielectric material 208 may conform to the underlying shape of the barrier layer 106 and the conductive member 110. The process 200C may include deposition of a layer of a second dielectric material 210 onto the first dielectric material 208. The second dielectric material 210 may fill up the recess 202. The layer of first dielectric material 208 may become the first dielectric layer 108 after further processes. The layer of second dielectric material 210 may become the second dielectric layer 112 after further processes.

Figure 2D:
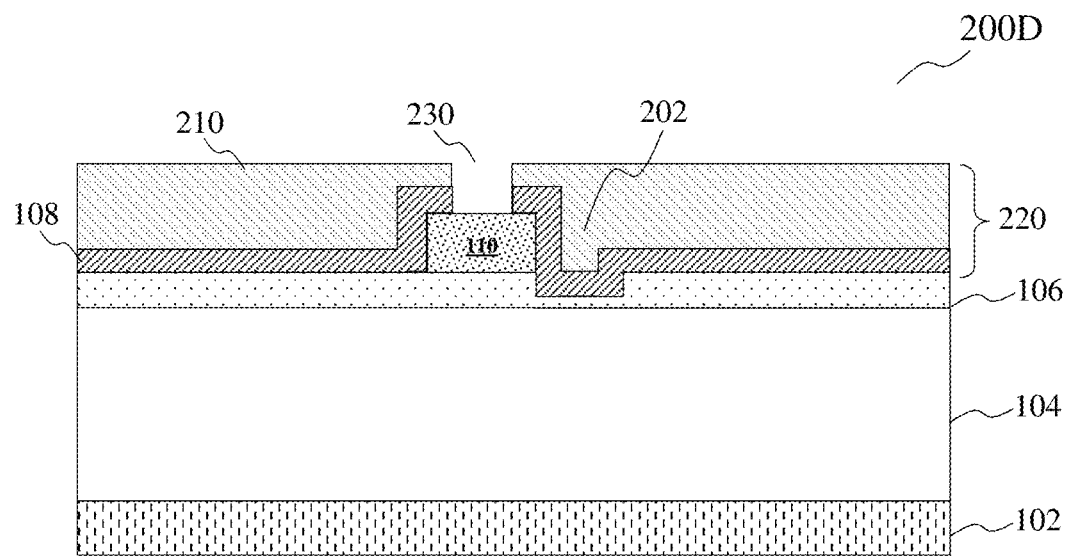

Referring to FIG. 2D, the method may include a process 200D. The process 200D may include forming a first trench 230 in the dielectric stack 220, over the conductive member 110. The process 200D may include removing a portion of the first dielectric material 208 and a portion of the second dielectric material 210 to open a window to the conductive member 110. The process 200D may include forming a second mask layer (not shown) over the second dielectric material 210, and patterning the second mask layer to form an opening above the conductive member 110. The process 200D may further include etching the dielectric stack 220 through the patterned second mask layer. The etching process may remove part of the first and second dielectric materials 208, 210 through the opening in the second mask layer, to form the first trench 230. Following the etching process, the second mask layer may be removed. The first trench 230 may extend through an entire thickness of the dielectric stack 220, in other words, form a through hole in the dielectric stack 220. The first trench 230 may extend to the conductive member 110. The first trench 230 may also be referred herein as a p-GaN window. The layer of first dielectric material 208 that results from the process 200D may be referred to as the first dielectric layer 108.

Figure 2E:
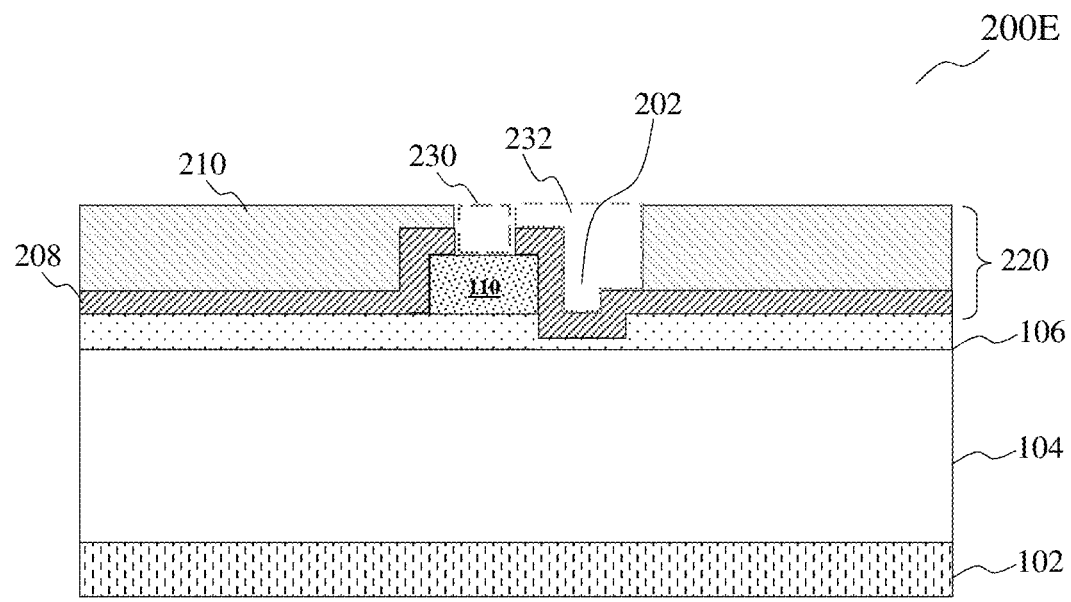

Referring to FIG. 2E, the method may include a process 200E. The process 200E may include forming a second trench 232 in the dielectric stack 220. The second trench 232 may be adjacent to the first trench 230. The second trench 232 may extend to the first dielectric material 208. The process 200E may include removing a portion of the second dielectric material 210, to form the second trench 232 over the first dielectric material 208. The second trench 232 may be formed over the recess 202. The second trench 232 may be wider than the recess 202 such that the second trench 232 extends horizontally from the recess 202. In alternative embodiments, the second trench 232 may be of the same width as, or narrower than, the recess 202, such that the entire second trench 232 may be formed over the recess 202. The second trench 232 may also be referred herein as a MIS-shield window. The layer of second dielectric material 210 that results from the process 200E may be referred to as the second dielectric layer 112.

Forming the second trench 232 may include forming a third mask layer (not shown) over the second dielectric material 210. The third mask layer may be patterned to provide an opening that is offset from the first trench 230. The process 200E may further include etching the second dielectric material 210 through the third mask layer. The etching process may remove part of the second dielectric material 210 through the opening in the third mask layer to form the second trench 232. Following the etching process, the third mask layer may be removed.

Figure 2F:
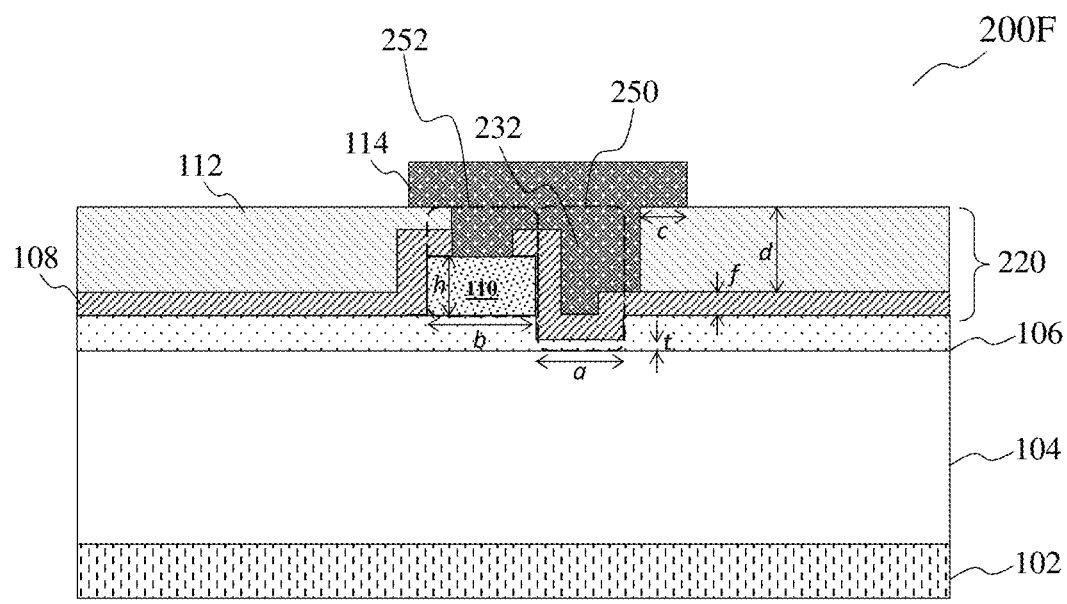

Referring to FIG. 2F, the method may include a process 200F. The process 200F may include forming the gate metal 114. The process 200F may include depositing a metal over the dielectric stack 220, and etching the deposited metal. The deposited metal may fill the first and second trenches 230, 232. The gate metal 114 may be partially supported by the second dielectric layer 112.

The method of fabricating the transistor 100 may further include forming the source contact 140 and the drain contact 142. Forming the source and drain contacts 140, 142 may include etching the dielectric stack 220 and the barrier layer 106, to form a source opening and a drain opening. The source opening and the drain opening may each extend to the buffer layer 104. The source opening may be formed nearer to the conductive member 110 than to the recess 202. The drain opening may be formed nearer to the recess 202 than to the conductive member 110. The source and drain openings may be formed at opposite sides of the gate metal 114. Forming the source and drain contacts 140, 142 may further include depositing a metal into the source opening and the drain opening. The deposited metal may be etched, to form the source and drain contacts 140, 142. The process of depositing the metal into the source and drain openings may be performed concurrently with the process 200F. The process of etching the deposited metal to form the source and drain contacts 140, 142 may also be performed concurrently with the process 200F, using the same etch mask.

The above described order for the method is only intended to be illustrative, and the method is not limited to the above specifically described order unless otherwise specifically stated.

Figure 3A:
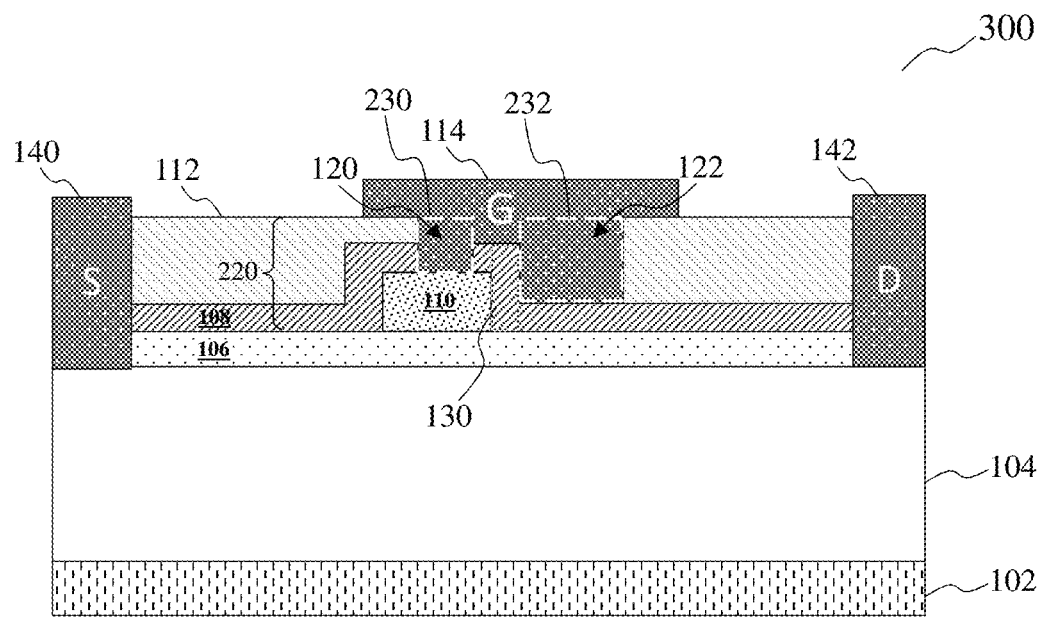
FIG. 3A shows a simplified cross-sectional view of a transistor according to alternative non-limiting embodiments.

FIG. 3A shows a simplified cross-sectional view of a transistor 300 according to alternative non-limiting embodiments. The transistor 300 may be different from the transistor 100, in that the barrier layer 106 does not have a recess. Accordingly, the first dielectric layer 108 that overlays the barrier layer 106 does not line the recess Compared to the transistor 100, the barrier layer 106 that lies under the MIS shield 250 may be thicker. Other than that, the transistor 300 may be similar to the transistor 100, in that it includes a substrate 102, a buffer layer 104, a barrier layer 106, a dielectric stack 220, a conductive member 110, a gate metal 114, a source contact 140, and a drain contact 142, and thus, the common features are labeled with the same reference numerals and need not be discussed.

Figure 3B:
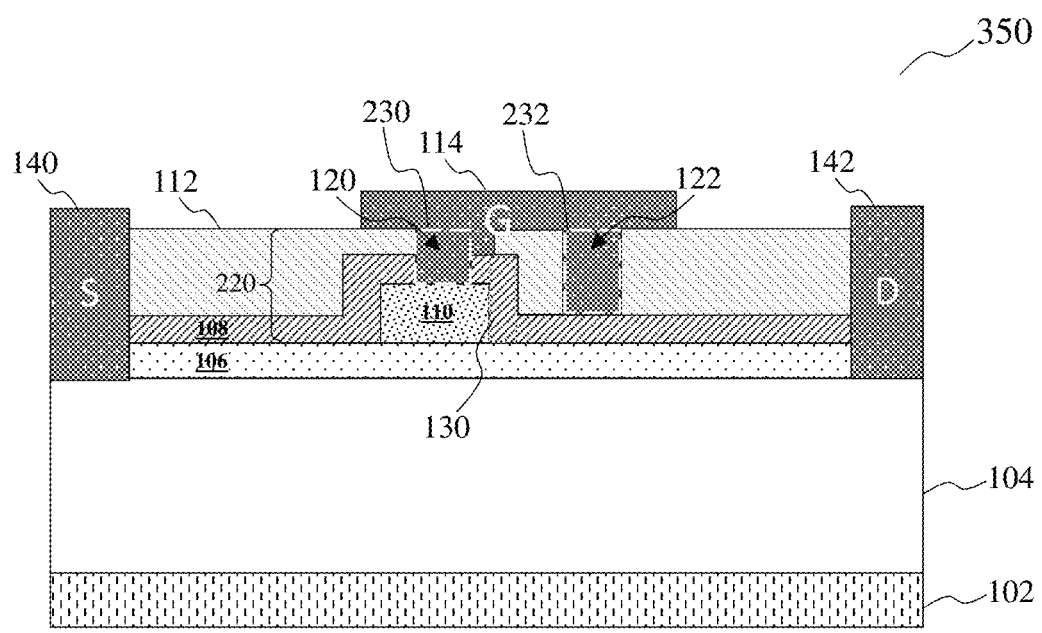
FIG. 3B shows a simplified cross-sectional view of a transistor according to alternative non-limiting embodiments.

FIG. 3B shows a simplified cross-sectional view of a transistor 350 according to various non-limiting embodiments. The transistor 350 may be similar to the transistor 300. However, in the transistor 350, the second trench 232 may not be adjacent to the first trench 230. The second dielectric layer 112 may be partially disposed between the first trench 230 and the second trench 232. In other words, the second trench 232 may be separated from the first trench 230 by a portion of the second dielectric layer 112.

FIGS. 4A to 4D show simplified cross-sectional views illustrating a method of fabricating the transistor 300 according to various non-limiting embodiments. For clarity of illustration, some reference numerals have been omitted from FIGS. 4A to 4D.

Figure 4A:
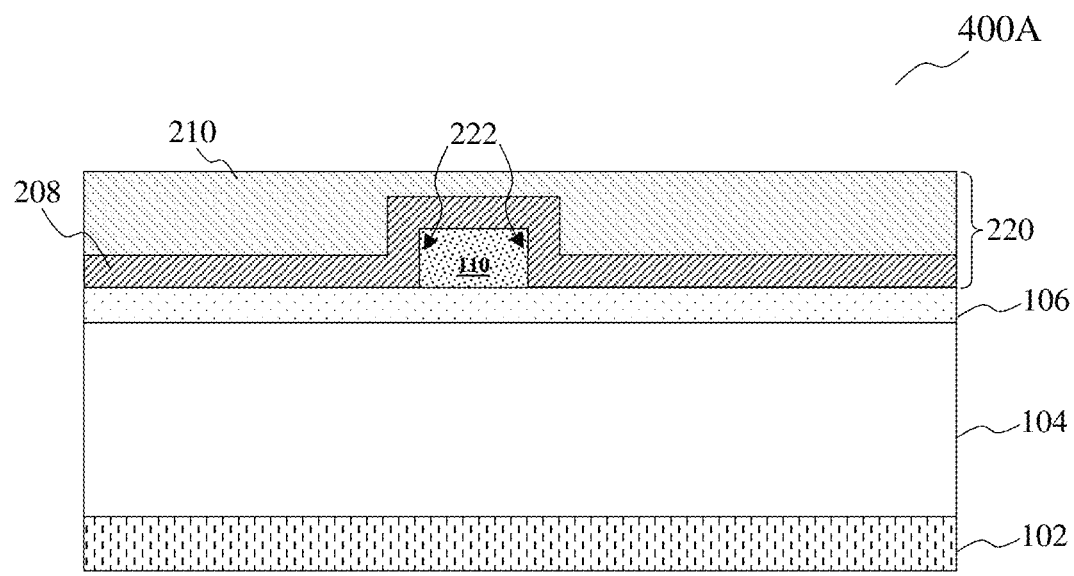
FIGS. 4A to 4D show simplified cross-sectional views illustrating a method of fabricating the transistor of FIG. 3, according to various non-limiting embodiments.

Referring to FIG. 4A, the method may include a process 400A. The process 400A may include forming the dielectric stack 220 on the device formed in the process 200A. The process 400A may be similar to the process 200C described with respect to FIG. 2C, in that it may include depositing a layer of first dielectric material 208 on the barrier layer 106 and the conductive member 110, and depositing a layer of second dielectric material 210 on the layer of first dielectric material 208.

Figure 4B:
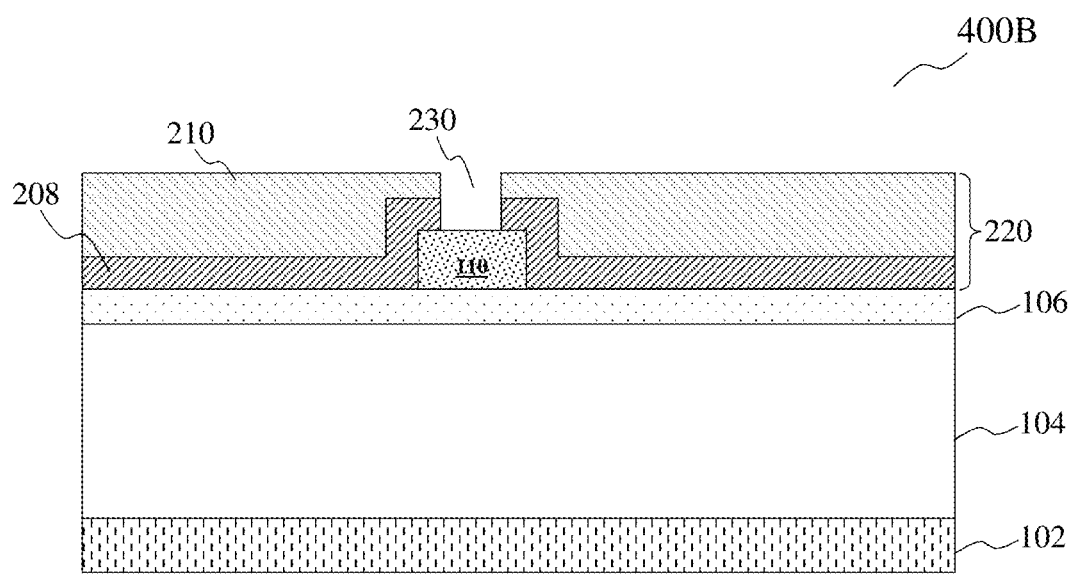

As shown in FIG. 4B, the method may include a process 400B. The process 400B may include forming the first trench 230, in a manner similar to the process 200D described with respect to FIG. 2D.

Figure 4C:
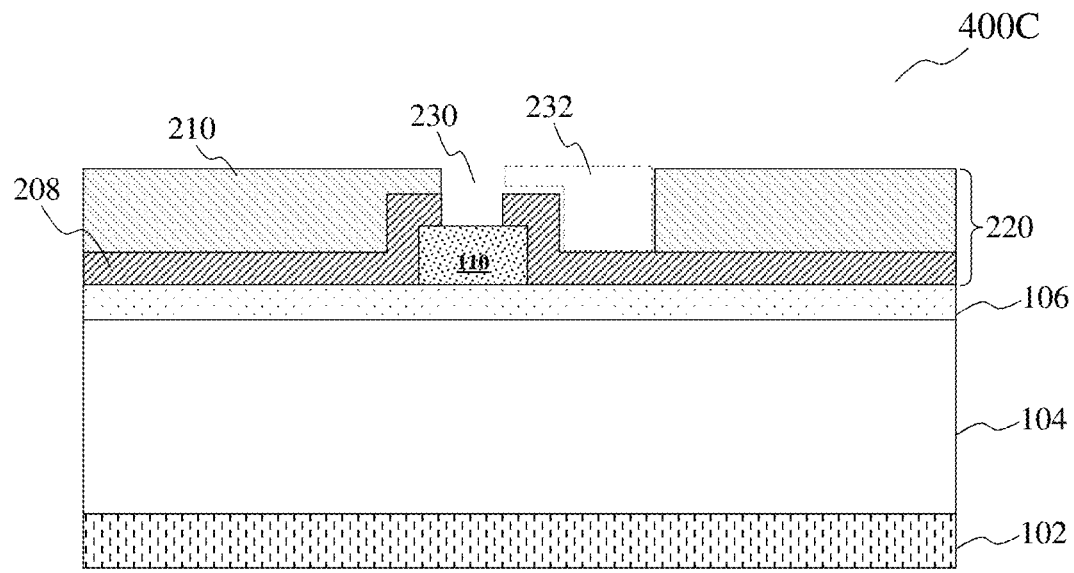

Referring to FIG. 4C, the method may include a process 400C. The process 400C may include forming the second trench 232, in a manner similar to the process 200E described with respect to FIG. 2E.

Figure 4D:
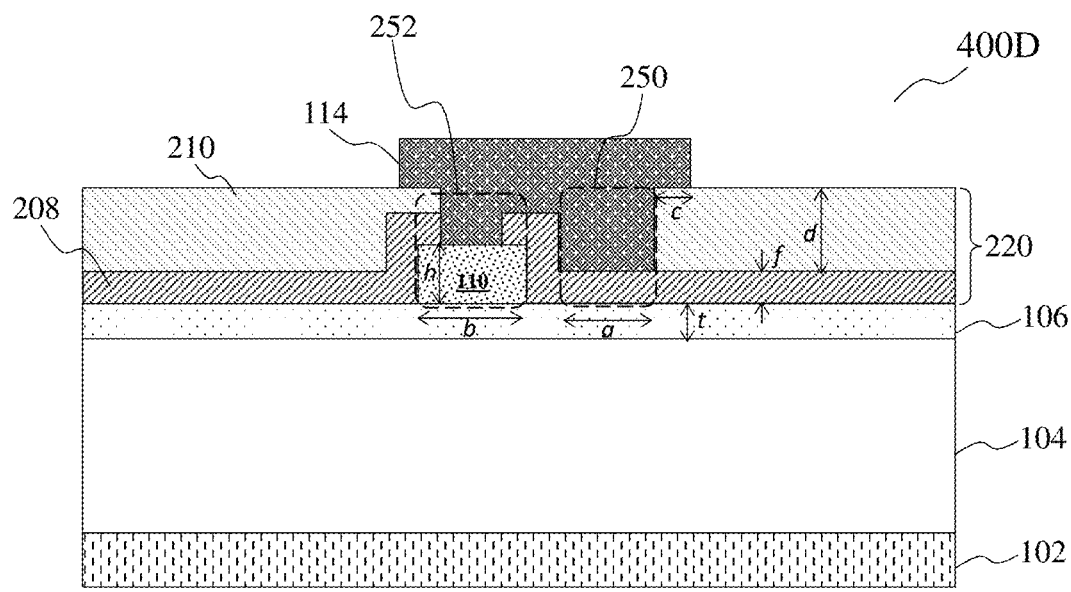

Referring to FIG. 4D, the method may include a process 400D. The process 400D may include forming the gate metal 114, in a manner similar to the process 200F described with respect to FIG. 2F. The gate metal 114 may include a first region 120 that fills the first trench 230, and a second region 122 that fills the second trench 232.

The method of fabricating the transistor 300 may further include forming the source contact 140 and the drain contact 142. Forming the source and drain contacts 140, 142 may include etching the dielectric stack 220 and the barrier layer 106, to form a source opening and a drain opening. The source opening and the drain opening may each extend to the buffer layer 104. The source opening may be formed nearer to the conductive member 110 or the first region 120 of the gate metal 114, than to the second region 122 of the gate metal 114. The drain opening may be formed nearer to the second region 122 than to the first region 120. The source and drain openings may be formed at opposite sides of the gate metal 114. Forming the source and drain contacts 140, 142 may further include depositing a metal into the source opening and the drain opening. The deposited metal may be etched, to form the source and drain contacts 140, 142. The process of depositing the metal into the source and drain openings may be performed concurrently with the process 400D. The process of etching the deposited metal to form the source and drain contacts 140, 142 may also be performed concurrently with the process 400D, using the same etch mask.

The above described order for the method is only intended to be illustrative, and the method is not limited to the above specifically described order unless otherwise specifically stated.

Characteristics of the transistors 100 and 300 are further described here, with respect to FIGS. 2F and 4D.

Referring to FIG. 2F, the transistor 100 may include a p-GaN gate 252. The p-GaN gate 252 may include the conductive member 110 and part of the gate metal 114 that lies directly above the conductive member 110. The p-GaN gate 252 may ensure that the transistor 100 is operable as an enhancement mode transistor. In other words, the transistor 100 may be normally-off.

The transistor 100 may include a Metal-Insulator-Semiconductor (MIS) shield 250. The MIS shield 250 may be provided at the drain side of the gate metal 114. The MIS shield 250 may include the gate metal within the second trench 232 and its underlying first dielectric layer 108 and barrier layer 106. The first dielectric layer 108 may function as an insulator of the MIS shield 250 and may also serve as surface passivation for the barrier layer 106. During operation of the transistor 100, the MIS shield 250 may draw the electric field to itself, such that the electric field at the p-GaN gate 252 is comparatively weak. Consequently, the p-GaN gate 252 may be protected from degradation and its reliability may be enhanced.

Electrical charges may accumulate in the p-GaN gate 252 when a reverse bias is applied at an interface between the p-GaN gate 252 and the barrier layer 106, referred herein as the p-GaN junction. This accumulation of electrical charges may not recover immediately when the transistor 100 switches from high drain bias OFF-state to low drain bias ON-state since the conductive layer 110 forms a Schottky contact to the gate metal 114 and conductive member 110 may be electrically floating, which cause the threshold voltage value to shift, thereby resulting in an unstable threshold voltage. The MIS shield 250 may shield the p-GaN junction from the reverse gate-to-drain bias. As a result, the MIS shield 250 may suppress drain induced shifts in the threshold voltage of the p-GaN gate 252, such that the transistor 100 has a stable threshold voltage value.

Various dimensions of components of the transistor 100 are indicated in FIG. 2F. The thickness of the barrier layer 106 under the MIS shield 250 is denoted as t. The thickness of the first dielectric layer 108 is denoted as f. The thickness of the second dielectric layer 112 is denoted as d. The width of the p-GaN gate 252, i.e. width the conductive member 110, is denoted as b. The width of the MIS shield 250 is denoted as a. The gate metal overhang width, in other words, the width of a portion of the gate metal 114 that is disposed over the second dielectric layer 112, is denoted as c. The height of the conductive member 110 may be denoted as h.

According to various non-limiting embodiments, a may be about 1 um; b may be in a range of about 0.5 um to about 1.5 um; c may be about 0.5 um; d may be about 200 nm; f may be in a range of about 5 nm to about 40 nm, preferably in a range of about 10 nm to about 20 nm; and t may be less than or equal to 30 nm.

The electric field strength under the p-GaN gate 252 and the MIS shield 250 may depend on the values of a, c, d and t.

The gate leakage current and saturation current may depend on the values of t, and the ratio of a to b. The gate leakage current may be dominated by the p-GaN gate 250, and may be reduced by shrinking b. As the carrier density under the p-GaN gate 250 is different from the carrier density under the MIS shield 250, the saturation current may be modulated by adjusting t.

The electric field strength at the gate corner, i.e. at the corner interface between the gate metal 114 and the second dielectric layer 112 where the gate metal 114 is disposed over the second dielectric layer 112, may depend on the values of c and d. The overhang of the gate metal 114 on the second dielectric layer 112 may function as a field plate. A long overhang, i.e. a large value for c may decrease the distance between the field plate and the drain contact 142, and increase the electric field strength at the field plate edge, while a short overhang cannot lower the electric field strength at the MIS shield 250.

$R_{ON}$ and the saturation current may depend on the values of a, b and t. A larger value for t increases the carrier density, which would decrease $R_{ON}$ and increase the electric field strength as it becomes more difficult to deplete the channel and the gate metal 114 becomes closer to the channel. A smaller value for t decreases the carrier density and degrades the mobility of charges, which increases $R_{ON}$.

The drain current density and gate reliability may depend on f A thicker f may increase the distance between the gate metal 114 and the channel, leading to weaker gate control, less carrier density and less drain current density; while a thicker f may improve the gate reliability.

The breakdown voltage may depend on the value of d. Adjusting d may achieve a more uniform electric field and thereby improve the breakdown voltage of the transistor 100.

According to various non-limiting embodiments, the height of the conductive member 110, h, may be larger than the height of the first dielectric layer 108, d, such that the height of the first region 120 is smaller than the height of the second region 122.

Referring to FIG. 4D, common features between the transistors 100 and 300 are labeled with the same reference numerals. The dimensions described above in relation to the transistor 100 also apply to the transistor 300. In the following, differences in characteristics between the transistor 100 and the transistor 300 will be described.

The transistor 100 may have a more stable threshold voltage than the transistor 300. In the transistor 100, the barrier layer 106 under the MIS shield 250 is narrower than that in the transistor 300. In other words, t is smaller in the transistor 100 than in the transistor 300. For example, t may be in a range of 20 to 30 nm in the transistor 300, while t may be in a range of 2 to 20 nm in the transistor 100. As a result, there are less charge carriers in the channel under the MIS shield in the transistor 100, leading to a less negative pinch-off voltage under the MIS shield 250. For example, the pinch-off voltage under the MIS shield 250 may be in a range of about −1V to −5V for the transistor 100, and may be in a range of about −7V to −12V for the transistor 300. As a result, the MIS channel in the transistor 300 may pinch off in a relatively large drain bias, leading to less efficiency in suppressing the instability of the p-GaN gate threshold voltage.

The transistor 100 may be more challenging to fabricate as compared to the transistor 300. The fabrication process of the transistor 100 requires an extra step, as described with respect to FIG. 2B. Also, in the transistor 100, the interface between the first dielectric layer 108 and the barrier layer 106 has to be smooth, to avoid high scattering and low mobility of charge carriers.

In the following, simulation results of the transistor 100, including comparisons of its characteristics with prior art p-GaN HEMT and prior art metal-insulator-semiconductor (MIS) HEMT will be described.

Figure 5A:
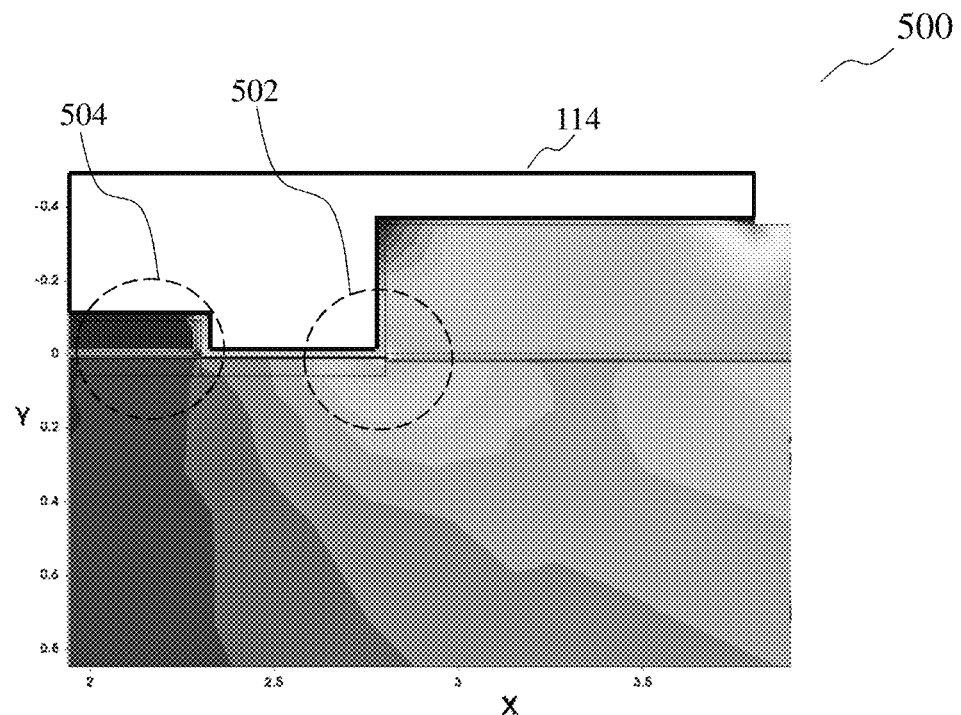
FIG. 5A shows a simulated heatmap of the electric field in a partial cross-section of the transistor of FIG. 1.

FIG. 5A shows a simulated heatmap 500 of the electric field in a partial cross-section of the transistor 100. In the simulation, the gate voltage ($V_G$) is set as 0V, while the drain voltage ($V_D$) is set as 200V. The heatmap 500 shows that the electric field is concentrated at the MIS shield gate edge 502. In other words, the electric field strength is high at the MIS shield gate edge 502. The MIS shield edge 502 is a region in the dielectric stack 220, that is around the second region 122 of the gate metal 114. Comparatively, the electric field strength at the p-GaN gate edge 504, may be lower. The p-GaN gate edge 504 is a region in the dielectric stack 220, that is around the first region 120 of the gate metal 114 that contacts the conductive member 110. As the electric field strength is concentrated at the MIS shield gate edge 502 instead of at the p-GaN gate edge 504, the conductive member 110 may be protected from degradation even after long term operation. Also, since the conductive member 110 does not sustain high electric field or reverse voltage, the drain induced dynamic $V_{th}$ shift may be suppressed. In prior art transistors without the MIS shield, the electric field strength may be focused at the p-GaN gate edge 504, as shown in FIG. 5B.

Figure 5B:
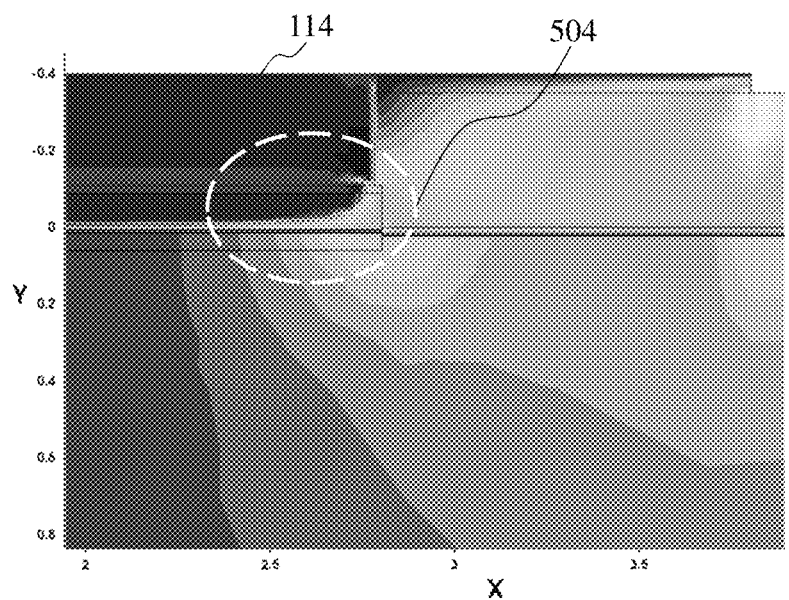
FIG. 5B shows a simulated heatmap of the electric field in a partial cross-section of a prior art transistor, for comparison against FIG. 5A.

FIG. 5B shows a simulated heatmap of the electric field in a partial cross-section of a prior art transistor, for comparison against the transistor 100. The prior art transistor may be a p-GaN HEMT that does not have a MIS shield. The heatmap of FIG. 5B shows that the electric field is concentrated at the p-GaN edge 504 of the prior art transistor.

Figure 6:
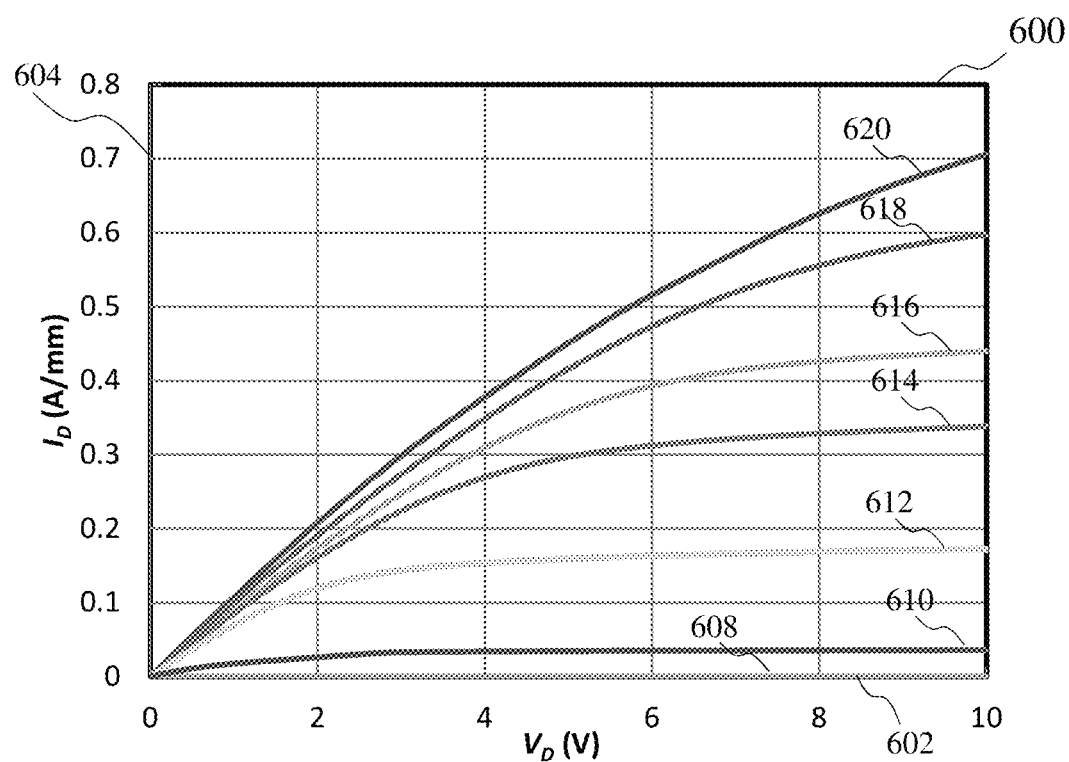
FIG. 6 is a graph that shows how the drain current (ID) varies with the drain voltage (VD), for the transistor of FIG. 1.

FIG. 6 is a graph 600 that shows how the drain current (ID) varies with the drain voltage ($V_D$), for the transistor 100. The graph 600 includes a horizontal axis 602 indicating the drain voltage in volts, and a vertical axis 604 indicating the drain current density in amperes per millimeter. In the simulation, the thickness of the first dielectric layer 108, f is set as 20 nm, the width of the p-GaN gate 252, b, is 1.0 um, and the width of the MIS shield 250, a, is 0.5 um. The simulation is repeated at steps of 1V, for gate voltage ($V_G$) of 1V to 7V, thereby generating plot 608 where $V_G$=1V, plot 610 where $V_G$=2V, plot 612 where $V_G$=3V, plot 614 where $V_G$=4V, plot 616 where $V_G$=5V, plot 618 where $V_G$=6V, and plot 620 where $V_G$=7V. At a drain voltage of 1V and gate voltage of 7V, the on-resistance ($R_{ON}$) of the transistor 100 is about 9.3 Ωmm. This may be comparable to a prior art p-GaN HEMT.

Figure 7:
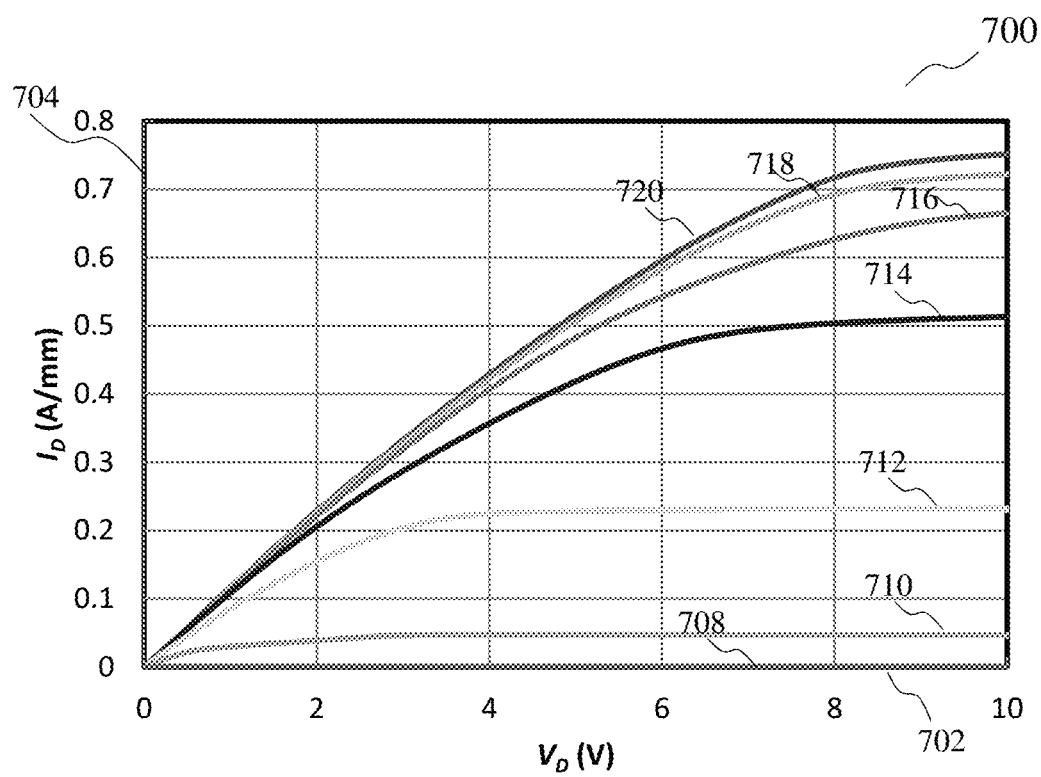
FIG. 7 is a graph that shows how ID varies with VD, for the transistor of FIG. 1.

FIG. 7 is a graph 700 that shows how $I_D$ varies with $V_D$, for the transistor 100, similar to the graph 600. The graph 700 also includes a horizontal axis 702 indicating the drain voltage in volts, and a vertical axis 704 indicating the drain current density in amperes per millimeter. The graph 700 differs from the graph 600, in that in the simulation, the thickness of the first dielectric layer 108, f, is set as 10 nm. The width of the p-GaN gate 252, b, is 1.0 um, and the width of the MIS shield 250, a, is 0.5 um. The simulation is repeated at steps of 1V, for gate voltage ($V_G$) of 1V to 7V, thereby generating plot 708 where $V_G$=1V, plot 710 where $V_G$=2V, plot 712 where $V_G$=3V, plot 714 where $V_G$=4V, plot 716 where $V_G$=5V, plot 718 where $V_G$=6V, and plot 720 where $V_G$=7V. At a drain voltage of 1V and gate voltage of 7V, the on-resistance ($R_{ON}$) of the transistor 100 is about 8.4 Ωmm. The on-resistance decreases with reduced thickness of the first dielectric layer 108. If the dielectric material used for the first dielectric layer 108 is robust, in other words, the critical electric field of the dielectric material is high, the thickness of the first dielectric layer 108 may be further reduced by decreasing the thickness of the first dielectric layer 108. An example of a robust dielectric material may be $SiN_x$, deposited by low pressure chemical vapor deposition (LPCVD).

Figure 8:
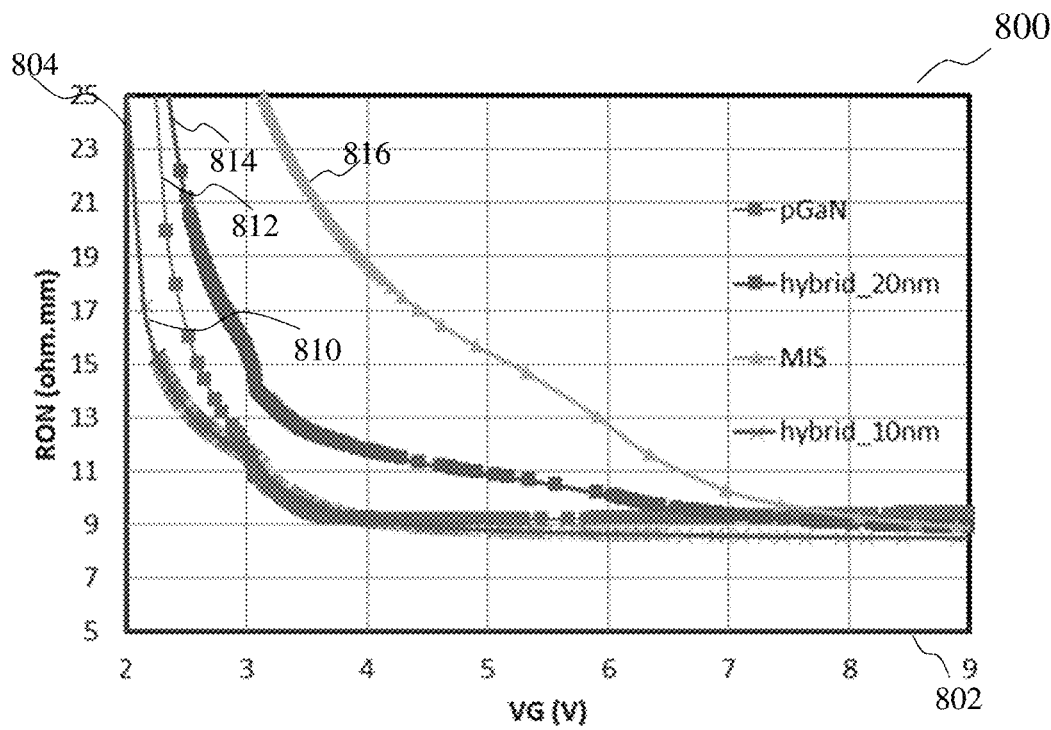
FIG. 8 is a graph that shows how on-resistance varies with the gate voltage, for various types of transistors, at a drain voltage of 1V.

FIG. 8 is a graph 800 that shows how on-resistance varies with the gate voltage, for various types of transistors, at a drain voltage of 1V. The graph 800 includes a horizontal axis 802 indicating the gate voltage ($V_G$) in volts, and a vertical axis 804 indicating the on-resistance ($R_{ON}$) in ohms-millimeter. The graph 800 includes plot 810 for transistor 100 with f=10 nm, plot 812 for a prior art p-GaN HEMT, plot 814 for the transistor 100 with f=20 nm, and plot 816 for a prior art MIS HEMT. The on-resistance of the transistor 100 with f=20 nm is lower than the on-resistance of the prior art p-GaN HEMT when $V_G$>7V. The on-resistance can be further lowered, by reducing the thickness of the first dielectric layer 108, as shown by the plot 810.

Figure 9A:
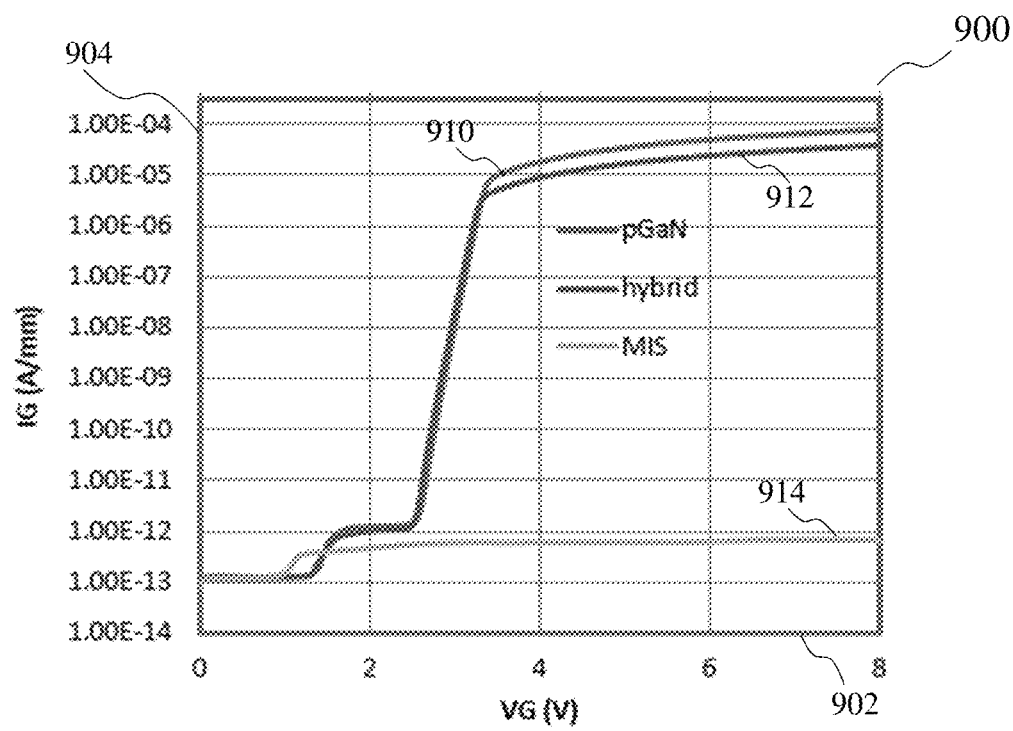
FIG. 9A is a graph that shows how leakage current varies with the gate voltage, for the transistor of FIG. 1.

FIG. 9A is a graph 900 that shows how leakage current varies with the gate voltage, for the transistor 100. The graph 900 includes a horizontal axis 902 indicating the gate voltage ($V_G$) in volts, and a vertical axis 904 indicating the leakage current ($I_G$) in amperes per millimeter. The graph 900 includes plot 910 for the prior art p-GaN HEMT, plot 912 for the transistor 100, and plot 914 for the prior art MIS HEMT.

Figure 9B:
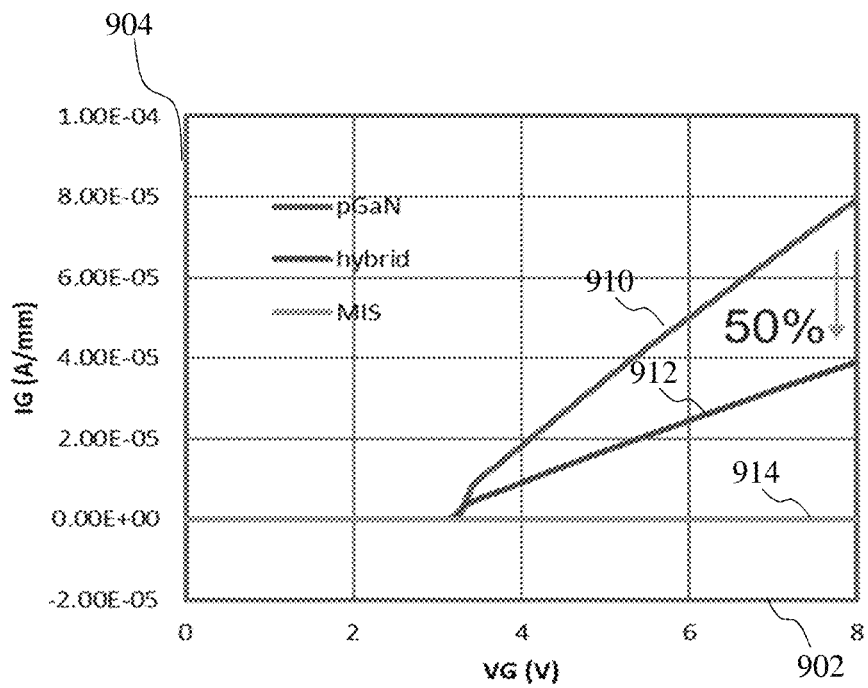
FIG. 9B shows an enlarged view of the graph of FIG. 9A, for leakage current values of −2.00E-05 to 1.00E-04.

FIG. 9B shows an enlarged view of the graph 900, for leakage current values of −2.00E-05 to 1.00E-04. It can be seen from the graph 900, that the leakage current of the transistor 100 is substantially lower than that of the prior art p-GaN HEMT. The leakage current of the transistor 100 is about 50% of the leakage current of the prior art p-GaN HEMT.

As shown by the simulation results, the transistor 100 can be operated as an enhancement mode transistor. The transistor 100 may achieve at least substantially uniform threshold voltage. The effects of the non-uniformity of thickness in the etched barrier layer 106 that results from the recess 202, on the on-resistance may be acceptable. The MIS shield of the transistor 100 may suppress charge storage, in other words, ionized acceptor, in the p-GaN gate, as the reverse voltage is at the junction between the MIS shield and the access region. The access region is a lateral region between the drain side MIS shield gate edge 502 and the drain contact 142. As a result, drain-induced shift in the threshold voltage may be suppressed by the MIS shield. In the transistor 100, the p-GaN gate may be protected by the MIS shield, as the electric field is concentrated at the MIS shield region instead of at the p-GaN gate. As a result, the p-GaN reliability may be enhanced, as compared to prior art p-GaN transistors.

It should be understood that the above described simulation results may be extrapolated to the transistor 300, which is largely similar in structure to the transistor 100.

Figure 10:
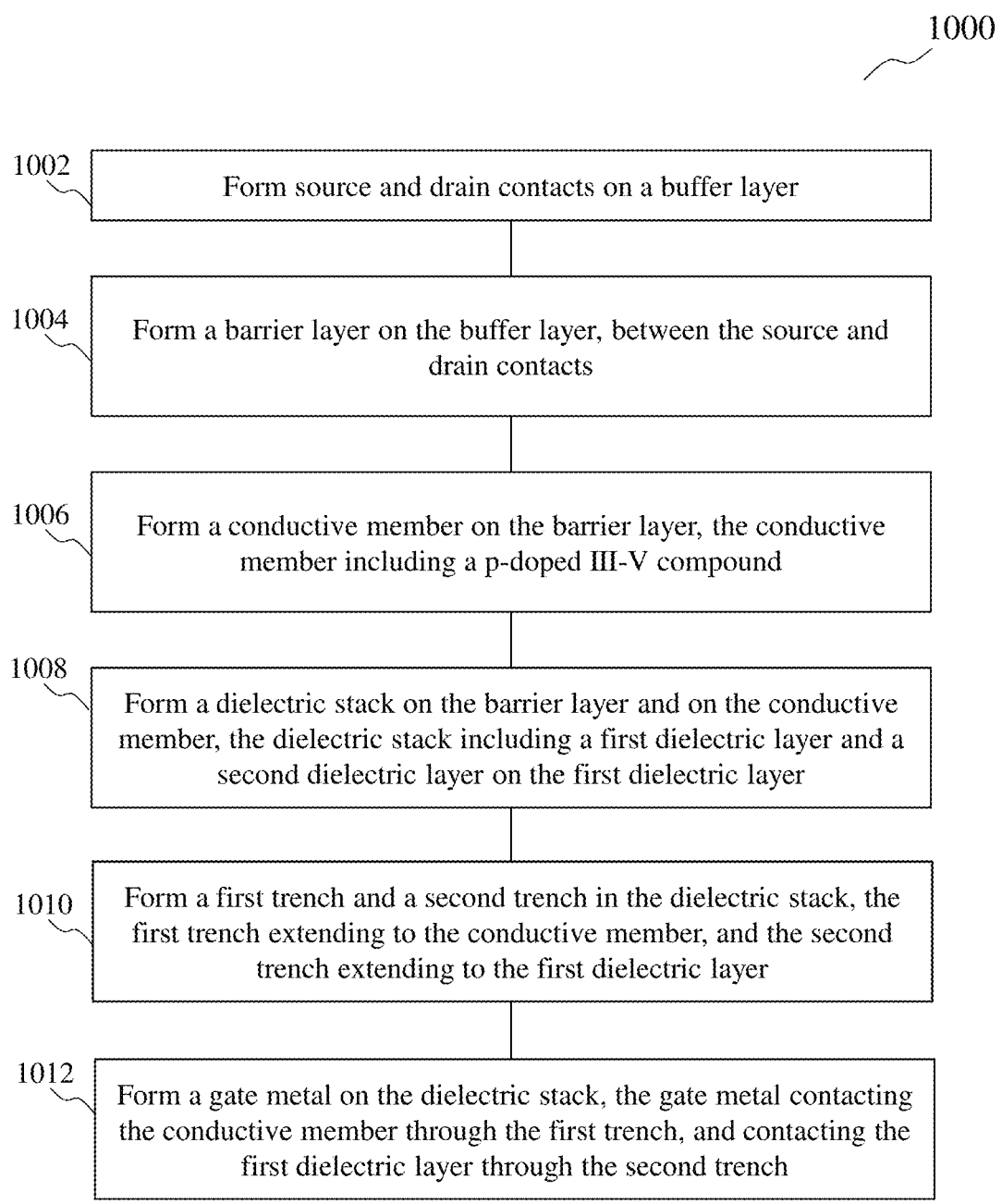
FIG. 10 shows a flow diagram of a method of fabricating a transistor, according to various non-limiting embodiments.

FIG. 10 shows a flow diagram 1000 of a method of fabricating a transistor, according to various non-limiting embodiments. The method may include forming source and drain contacts on a buffer layer in 1002. 1002 may take place before 1004, or may take place after 1012. The method may further include forming a barrier layer on the buffer layer between the source and drain contacts in 1004. For example, 1004 may include part of the process 200A, and may further include the process 200B. The method may further include forming a conductive member on the barrier layer in 1006. For example, 1006 may include part of the process 200A. The conductive member may include a p-doped III-V compound. The method may further include forming a dielectric stack on the barrier layer and on the conductive member in 1008. For example, 1008 may include the process 200C or the process 400A. The dielectric stack may include a first dielectric layer and a second dielectric layer on the first dielectric layer. The method may further include forming a first trench and a second trench in 1010. For example, 1010 may include the processes 200D and 200E. For example, 1010 may include the processes 400B and 400C. The first trench may extend to the conductive member. The second trench may extend to the first dielectric layer. The method may further include forming a gate metal on the dielectric stack in 1012. For example, 1012 may include the process 200F or the process 400D. The gate metal may contact the conductive member through the first trench and may further contact the first dielectric layer through the second trench.

Various modifications may be made to the above-described embodiments.

While FIGS. 2F and 4D show the p-GaN gate 252 to be adjacent to the MIS shield 250, they need not be adjacent to one another. The gate metal 114 may separate the MIS shield 250 and the p-GaN gate 252. The first and second trenches 230, 232 need not be adjacent to one another. The gate metal 114 may separate the first and second trenches 230, 232.

Also, while the figures show that the gate metal 114 is partially disposed on the second dielectric layer 112, the gate metal 114 may not extend over the second dielectric layer 112 in an alternative embodiment. In other words, the gate metal overhang width, c, may be zero.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:
1. A transistor comprising:
   a buffer layer;
   source and drain contacts on the buffer layer,
   a barrier layer on the buffer layer, wherein the barrier layer is arranged between the source and drain contacts;

a conductive member on the barrier layer, wherein the conductive member comprises a p-doped III-V compound;
a dielectric stack on the barrier layer and on the conductive member, wherein the dielectric stack comprises a first dielectric layer and a second dielectric layer on the first dielectric layer,
a first trench entirely through the first dielectric layer and the second dielectric layer such that a top surface of the conductive member, at least one sidewall of the first dielectric layer and at least one sidewall of the second dielectric layer are exposed in the first trench, wherein the first dielectric layer contacts the top surface the conductive member;
a second trench entirely through the second dielectric layer such that a top surface of the first dielectric layer and at least one sidewall of the second dielectric layer are exposed in the second trench; and
a gate metal on the dielectric stack, wherein the gate metal contacts the conductive member through the first trench, and wherein the gate metal contacts the first dielectric layer through the second trench.

2. The transistor of claim 1, wherein the second trench of the dielectric stack is between the drain contact and the conductive member.

3. The transistor of claim 1, wherein the gate metal is at least partially disposed on the second dielectric layer.

4. The transistor of claim 1, wherein the conductive member has a surface in contact with the barrier layer and side walls transverse to the surface, wherein the first dielectric layer contacts the side walls of the conductive member.

5. The transistor of claim 1, wherein the second trench is wider than the first trench or wherein the second trench is deeper than the first trench.

6. The transistor of claim 1, wherein the second trench is adjacent to the first trench.

7. The transistor of claim 1, wherein the first dielectric layer directly contacts the top surface of the conductive member.

8. The transistor of claim 1, wherein the first trench is arranged over the conductive member.

9. The transistor of claim 1, wherein the barrier layer has a recess, and the first dielectric layer extends into the recess, wherein the second trench is formed over the recess.

10. The transistor of claim 1, wherein the second dielectric layer is thicker than the first dielectric layer.

11. The transistor of claim 1, wherein the buffer layer comprises a III-V semiconductor material.

12. The transistor of claim 1, wherein the second dielectric layer has a different material composition than the first dielectric layer.

13. The transistor of claim 1, wherein the III-V compound comprises GaN.

14. A method of fabricating a transistor, the method comprising:

forming source and drain contacts on a buffer layer;
forming a barrier layer on the buffer layer, between the source and drain contacts;
forming a conductive member on the barrier layer, wherein the conductive member comprises a p-doped III-V compound;
forming a dielectric stack on the barrier layer and on the conductive member, wherein the dielectric stack comprises a first dielectric layer and a second dielectric layer on the first dielectric layer;
forming a first trench and a second trench in the dielectric stack, wherein the first trench penetrates through the first dielectric layer and the second dielectric layer such that a top surface of the conductive member, at least one sidewall of the first dielectric layer and at least one sidewall of the second dielectric layer are exposed in the first trench, wherein the first dielectric layer contacts the top surface of the conductive member, and wherein the second trench penetrates through the second dielectric layer such that a top surface of the first dielectric layer and at least one sidewall of the second dielectric layer are exposed in the second trench; and
forming a gate metal on the dielectric stack, wherein the gate metal contacts the conductive member through the first trench, and wherein the gate metal contacts the first dielectric layer through the second trench.

15. The method of claim 14, wherein forming the dielectric stack comprises:
depositing a first dielectric material on the barrier layer and the conductive member;
depositing a second dielectric material on the first dielectric material;
forming the first trench in the first dielectric material and the second dielectric material over the conductive member to form the first dielectric layer; and
forming the second trench in the second dielectric material to form the second dielectric layer.

16. The method of claim 14, further comprising:
forming the second trench adjacent to the first trench.

17. The method of claim 14, further comprising:
forming a recess in the barrier layer; and
depositing the first dielectric material in the recess.

18. The method of claim 17, further comprising:
forming the second trench in the second dielectric material over the recess.

19. The method of claim 14, further comprising forming the source and drain contacts on opposite sides of the gate metal such that the second trench is between the conductive member and the drain contact.

20. The method of claim 14, wherein forming the gate metal comprises depositing metal into the first trench and the second trench.

* * * * *